United States Patent [19]

Ishii et al.

[11] Patent Number: 5,553,488
[45] Date of Patent: Sep. 10, 1996

[54] DIAGNOSIS APPARATUS FOR VEHICLE CONTROL SYSTEM

[75] Inventors: Satoshi Ishii, Toyota; Takao Akatsuka, Aichi-ken, both of Japan

[73] Assignee: Toyota Jidosha Kabushiki Kaisha, Toyota, Japan

[21] Appl. No.: 554,205

[22] Filed: Nov. 6, 1995

Related U.S. Application Data

[63] Continuation of Ser. No. 287,395, Jul. 27, 1994, abandoned.

[30] Foreign Application Priority Data

Jul. 30, 1993 [JP] Japan .................. 5-190565

[51] Int. Cl.⁶ .................. G01M 15/00; G01M 17/00; B60R 16/02; F02D 45/00
[52] U.S. Cl. .................. 73/116; 73/117.3
[58] Field of Search .................. 73/116, 117.2, 73/117.3; 364/424.01

[56] References Cited

U.S. PATENT DOCUMENTS

| | | | |
|---|---|---|---|
| 4,739,482 | 4/1988 | Wrigge | 73/117.3 |
| 4,884,054 | 11/1989 | Moon, Sr. | 73/117.3 |
| 5,056,023 | 10/1991 | Abe | 73/117.3 |
| 5,111,686 | 5/1992 | Kamiya et al. | 73/117.3 |
| 5,216,915 | 6/1993 | Sakamoto | 73/117.3 |
| 5,287,737 | 2/1994 | Osawa et al. | 73/117.3 |
| 5,334,938 | 8/1994 | Kugler et al. | 73/117.2 |
| 5,357,787 | 10/1994 | Kuroda et al. | 73/117.3 |
| 5,357,790 | 10/1994 | Hosoya | 73/117.3 |

FOREIGN PATENT DOCUMENTS

| | | |
|---|---|---|
| 61-36008 | 2/1986 | Japan . |
| 62-188933 | 8/1987 | Japan . |
| 1219651 | 9/1989 | Japan . |
| 1301139 | 12/1989 | Japan . |

*Primary Examiner*—Richard Chilcot
*Assistant Examiner*—George M. Dombroske
*Attorney, Agent, or Firm*—Kenyon & Kenyon

[57] ABSTRACT

A diagnosing apparatus for use in a vehicle is disclosed. A microcomputer operates according to either a first mode or a second mode. The second mode being used for the diagnosis requiring a higher precision than the diagnosis according to the first mode. A first program for detecting the malfunction of a control system and a second program having a higher detection precision than the first program is stored in a memory. The operation mode of the microcomputer is selected in accordance with an extent of the malfunction. The diagnosis according to the first program and the second program are executed when the first mode and the second mode are selected, respectively. An operation status of the control system is detected by sensors the diagnosis is performed in the second mode. The diagnosis mode is forcibly returned to the first mode from the second mode when the status detected by the detecting means matches with a predetermined conditions.

20 Claims, 4 Drawing Sheets

DIAGNOSIS APPARATUS FOR VEHICLE CONTROL SYSTEM

This application is a continuation of application Ser. No. 08/281,395, filed Jul. 27, 1994, now abandoned.

BACKGROUND OF THE INVENTION

1. Field of the Invention

The present invention relates generally to a diagnosing apparatus which is used in a vehicle control system wherein signals are supplied from sensors to a microcomputer to control the driving of actuators, and which diagnoses malfunction of the control system using the microcomputer.

2. Description of the Related Art

There is known a diagnosing apparatus which performs self-diagnosis according to previously installed programs while a vehicle is running under normal conditions, and turns on an alarm lamp when detecting the malfunction to indicate where the malfunction takes place. The diagnosis of this apparatus, however, may not be completely reliable. When a vehicle is driven in various modes (driving conditions), this apparatus may not properly diagnose the occurrence of a malfunction even if it has occurred, or may erroneously diagnose the occurrence of a malfunction even if it has not occurred. When vehicles are diagnosed by qualified people, e.g., dealers, repairers, etc., the vehicles are driven in a predetermined mode to prevent erroneous diagnosis, or even the same diagnosing items may be checked by different methods to improve the precision of self-diagnosis. In other words, the self-diagnosis is carried out in repair shops in accordance with a special program newly prepared for this purpose.

The technique that relates to an apparatus which executes self-diagnosis in accordance with such two types of programs is disclosed in, for example, Japanese Unexamined Patent Publication No. 62-188933. This scheme uses a first program which is run in normal mode (first mode) and a second program which is run in check mode (second mode) at a higher detection precision than the first program. When a user drives a vehicle, the normal mode is selected and self-diagnosis is executed in accordance with the first program. At the time a vehicle is inspected or is repaired in a repair shop, the check mode is selected and self-diagnosis is executed in accordance with the second program.

The mode selection is performed based on the status of a test switch (test terminal) provided in the vehicle or the engine room and the status of the ignition switch. For example, the check mode (second mode) is selected in a repair shop when the ignition switch is set on and the test switch is closed, and the normal mode (first mode) is selected otherwise.

If a vehicle is returned to the user without releasing the check mode (first mode), i.e., without setting the test switch off after diagnosis in the repair shop is completed, the following problem arises. Even when a slight malfunction occurs while the user is driving the vehicle under the normal conditions, i.e., even when an instantaneous malfunction which hardly affects the driving occurs, such an event is diagnosed as a malfunction and the alarm lamp is lit. This is likely to make the user overanxious.

SUMMARY OF THE INVENTION

Accordingly, it is a primary object of the present invention to provide a diagnosing apparatus for a vehicle control system, which has high reliability. In connection with this object, even when an instantaneous malfunction that hardly affects the driving occurs while the user is driving the vehicle under the normal conditions, such an event is prevented from being diagnosed as a malfunction, so that a user does not become overanxious.

To achieve the foregoing and other objects and in accordance with the purpose of the present invention, an improvement of a diagnosing apparatus is proposed. The apparatus is used in a control system for a vehicle for controlling actuators based on signals from sensors transferred to a microcomputer to diagnose a malfunction of said control system by means of said microcomputer, wherein said microcomputer operates in a selected operation mode from a group consisting of a first mode and a second mode, said second mode being used for the diagnosis requiring a higher precision than the diagnosis according to the first mode. The apparatus comprises memory means for storing a first program for detecting the malfunction of said control system and a second program having a higher detection precision than said first program, and selecting means for selecting the operation mode of the microcomputer in accordance with an extent of the malfunction of the control system. The apparatus further includes executing means for executing the diagnosis according to the first program when the selecting means selects the first mode, and executing diagnosis according to the second program when the selecting means switches the operation mode from the first mode to the second mode, and setting means for setting a condition of said control system to return the operation mode of the microcomputer to the first mode from the second mode. The apparatus also has detecting means for detecting a status of said control system when the diagnosis is performed in the second mode, and return means for forcibly returning said diagnosis mode to the first mode from the second mode when the status detected by the detecting means matches with the conditions set by the setting means when the second mode is carried out.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

A self-diagnosing apparatus for a vehicle control apparatus according to one embodiment of the present invention will be described in detail with reference to FIGS. 1 through 3.

Figure 1:
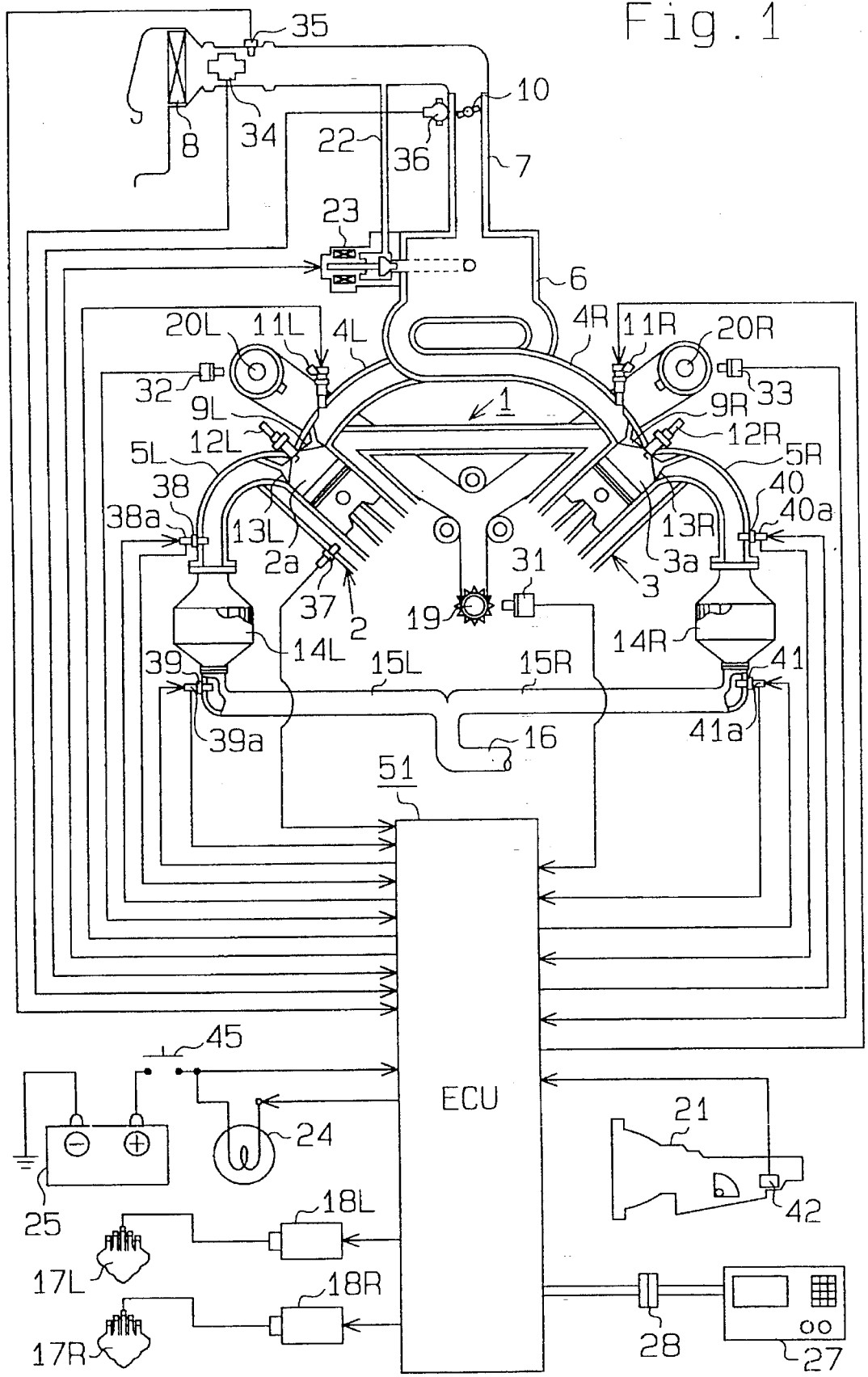
FIG. 1 is a diagram schematically illustrating the structure of a self-diagnosing apparatus for a vehicle control apparatus according to one embodiment of the present invention.

As shown in FIG. 1, a V shape engine 1 is mounted in a vehicle. The engine 1 has a crankshaft 19 extending perpendicular to the surface of the sheet of the drawing, and is separated in a V shape with the crankshaft 19 at the center, forming a pair of banks 2 and 3. Each of the banks 2 and 3 is provided with a plurality of cylinders arranged along the crankshaft 19. Intake manifolds 4L and 4R and exhaust manifolds 5L and 5R are connected to the banks 2 and 3, respectively.

The intake manifolds 4L and 4R are connected to a common surge tank 6 and a common air-intake pipe 7, with an air cleaner 8 provided at the inlet port of the air-intake pipe 7. Those intake manifolds 4L and 4R, the surge tank 6 and the air-intake pipe 7 constitute an air-intake passage. Air around the engine 1 is taken into the air-intake passage from the air cleaner 8, and is guided through the air-intake pipe 7 and surge tank 6 to the individual intake manifolds 4L and 4R. The guided air is led into combustion chambers 2a and 3a in the individual cylinders when the air-intake passage is opened by intake valves 9L and 9R.

A throttle valve 10 is rotatably attached to the air-intake pipe 7. The throttle valve 10 is coupled via a cable, etc., to an accelerator pedal, and rotates in responsive to the manipulation of the accelerator pedal by a driver. This rotation of the throttle valve 10 adjusts the air passing area of the air-intake passage, thereby controlling the amount of air (intake air amount Q), supplied to each combustion chamber 2a or 3a.

Fuel injectors 11L and 11R for injecting fuel in the combustion chambers 2a and 3a in the associated cylinders are attached to the intake manifolds 4L and 4R. Ignition plugs 12L and 12R are attached to the respective banks 2 and 3 in association with the respective cylinders. Each of the injectors 11L and 11R has a solenoid coil and a needle valve which functions when a current flows across the solenoid coil. When the needle valve functions, fuel fed under pressure from a fuel tank by a fuel pump (not shown) is injected toward the intake manifold 4L or 4R from each injector 11L or 11R. The injected fuel is mixed with air and this air-fuel mixture is supplied to each combustion chamber 2a or 3a. In the combustion chambers 2a and 3a, the supplied air-fuel mixtures are exploded and burned by the ignition plugs 12L and 12R, respectively.

The exhaust manifolds 5L and 5R constitute an exhaust passage. The gases produced in the combustion chambers 2a and 3a are led out to the exhaust manifolds 5L and 5R when the exhaust passage is opened by exhaust valves 13L and 13R. Three way catalytic converters 14L and 14R are respectively connected to the exhaust manifolds 5L and 5R. Each of the catalytic converters 14L and 14R oxidizes hydrocarbon (HC) and carbon monoxide (CO) in the exhaust gas and reduces nitrogen oxide (NOx) to thereby purge the exhaust gas. Exhaust pipes 15L and 15R are respectively connected to the catalytic converters 14L and 14R, and the downstream ends of the exhaust pipes 15L and 15R are combined to constitute a single exhaust pipe 16.

High voltages distributed by separate distributors 17L and 17R are applied to the associated ignition plugs 12L and 12R of the respective banks 2 and 3. The distributors 17L and 17R distribute high voltages, output from separate igniters 18L and 18R, to the ignition plugs 12L and 12R in synchronism with the rotation of a crankshaft 19. The ignition timings for the ignition plugs 12L and 12R are determined by the timings at which the high voltages are output from the igniters 18L and 18R.

The engine 1 is provided with an engine speed sensor 31 which detects the rotational speed of the crankshaft 19 (engine speed NE). The banks 2 and 3 are respectively provided with first and second cylinder sensors 32 and 33. Those sensors 32 and 33 detect the reference positions of individual cam shafts 20L and 20R which rotate in responsive to the crankshaft 19. Detection signals from both sensors 32 and 33 are used to discriminate the cylinders and to detect the positions of the valves 9L, 9R, 13L and 13R.

An air flow meter 34, which detects the intake air amount Q, is attached to the downstream side of the air cleaner 8. Provided in the vicinity of the air flow meter 34 is an inlet air temperature sensor 35 which detects the temperature of air (intake air temperature THA), led into the air-intake pipe 7. Provided in the vicinity of the throttle valve 10 is a throttle sensor 36 which detects the angle of the throttle valve 10 (throttle angle TA). A coolant temperature sensor 37 is attached to the engine 1 to detect the temperature of the coolant (coolant temperature THW).

A pair of air-fuel ratio sensors 38 and 39 are respectively provided at the upstream and downstream of the catalytic converter 14L in the exhaust passage. Likewise, another pair of air-fuel ratio sensors 40 and 41 are respectively provided at the upstream and downstream of the other catalytic converter 14R. Those sensors 38 to 41 each sense the density of oxygen (oxygen density Ox) remaining in the exhaust gas in order to detect the ratio of air to fuel (air-fuel ratio) in the mixtures supplied to the combustion chambers 2a and 3a. Those sensors 38 to 41 include sensor elements which have different temperature-dependent characteristics. To prevent the characteristics of the sensor elements from affected by the temperature, the air-fuel ratio sensors 38–41 are respective provided with heaters 38a, 39a, 40a and 41a, which generate heat to heat up the respective sensor elements when supplied with currents.

A transmission 21 coupled to the engine 1 is provided with a vehicle speed sensor 42 which detects the speed of the vehicle (vehicle speed SPD).

A bypass passage 22, which bypasses the throttle valve 10, connects the air-intake pipe 7 to the surge tank 6. Disposed in this passage 22 is an idle speed control valve (ISCV) 23. The ISCV 23 adjusts the intake air amount Q to allow the engine speed NE to converge to a predetermined value at the idling time of the engine 1 at which the air-intake passage is closed by the throttle valve 10. The ISCV 23 employed in this embodiment is of a type in which, when energized, the magnetic force of the coil changes to reciprocate the shaft, thereby adjusting the air flow area of the air-intake passage.

In this embodiment, an alarm lamp 24 is provided on an instrument panel (not shown) at the driver's seat. One lead line of this lamp 24 is connected to the positive terminal of a battery 25. When a malfunction occurs in any of the sensors 31 to 33 and 35 to 42 and the air flow meter 34, the alarm lamp 24 is lit to inform the driver of that malfunction.

The vehicle according to this embodiment has a self-diagnosis function which detects a malfunction in individual sections and stores and displays such a malfunction. For this diagnosis, an external diagnosing unit 27 is provided separately from the vehicle. This diagnosing unit 27 is equipped with various switches and a display for displaying the results of the diagnosis. The diagnosing unit 27 is generally placed in a repair shop and is connected to the vehicle via a connector 28 by a service engineer at the time the vehicle is inspected or repaired.

The aforementioned various sensors 31 to 33 and 35 to 42 and the air flow meter 34 are connected to an electronic control unit (ECU) 51. Also connected to this ECU 51 are the injectors 11L and 11R, the igniters 18L and 18R, the ISCV 23, the alarm lamp 24 and the heaters 38a to 41a. The battery 25 is connected via an ignition switch 45 to the ECU 51, so that when this switch 45 is set on, the voltage of the battery 25 (battery voltage) is applied to the ECU 51.

Based on the signals from the individual sensors 31 to 33 and 35 to 42 and the air flow meter 34, the ECU 51 performs various computations and make decisions to control the injectors 11L and 11R, the igniters 18L and 18R, the ISCV 23, the alarm lamp 24 and the heaters 38a to 41a.

Figure 2:
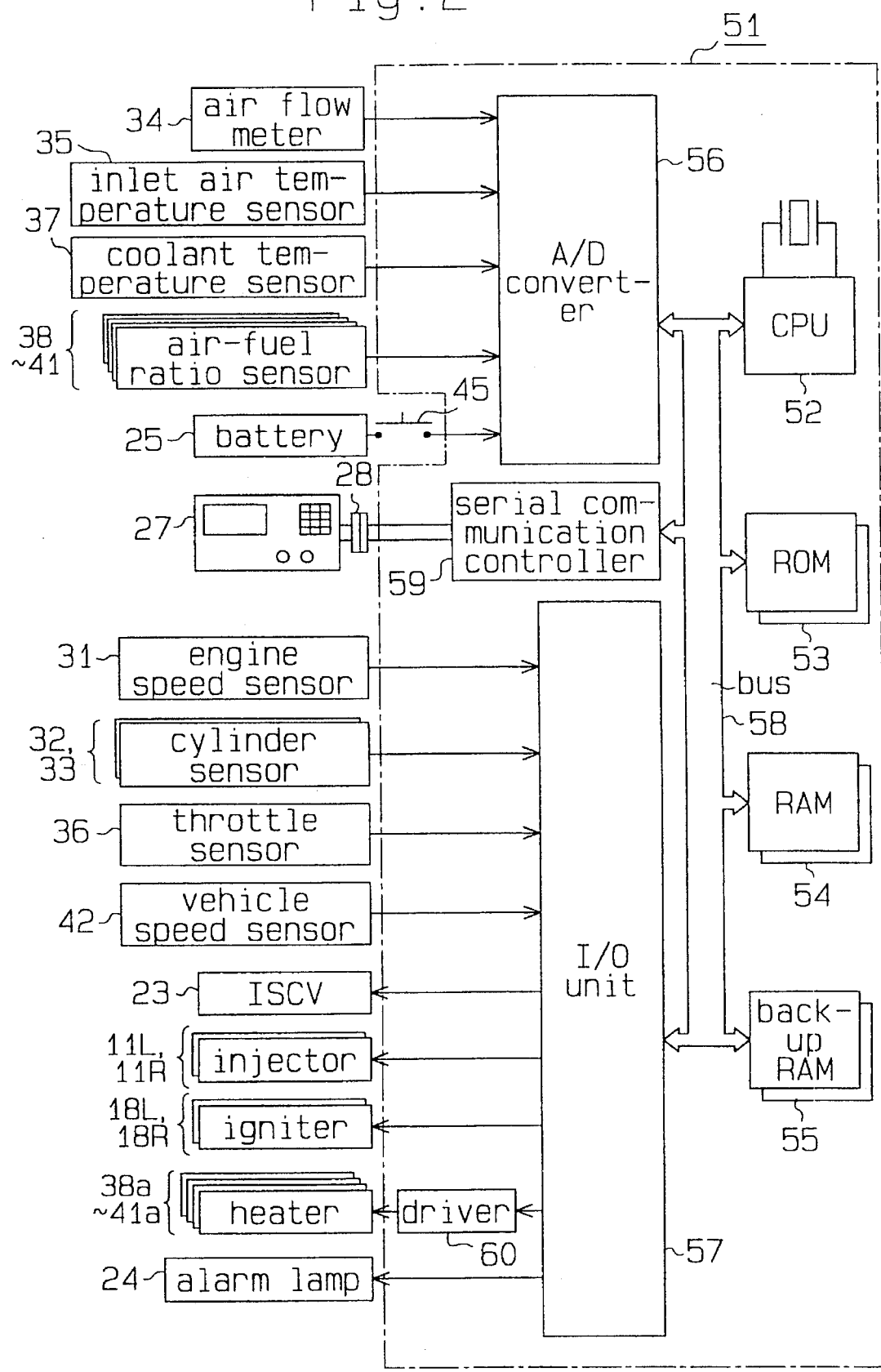
FIG. 2 is a block diagram showing the electric structure of an electronic control unit (ECU) in FIG. 1.
Figure 3:
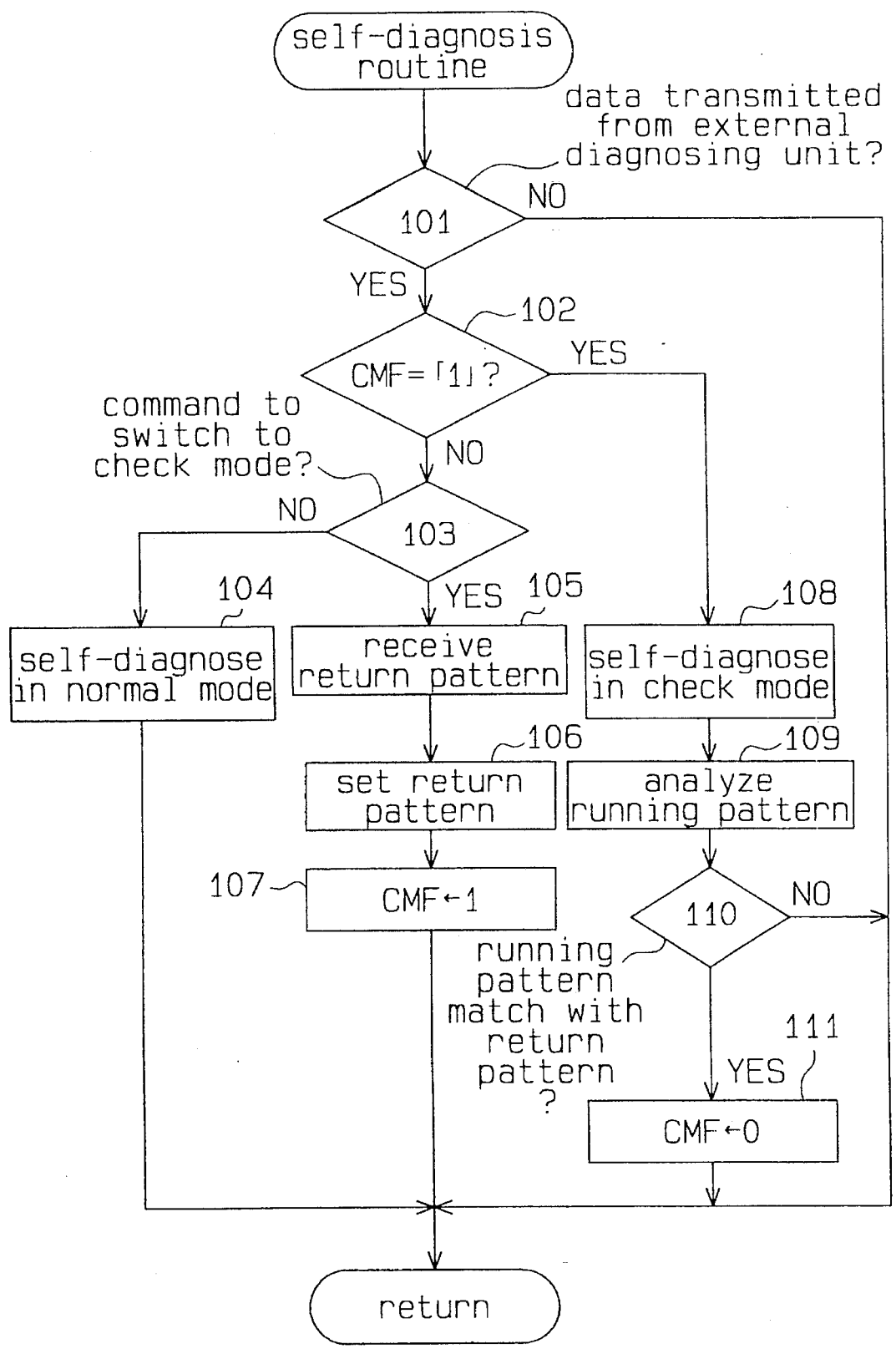
FIG. 3 is a flow chart illustrating a "self-diagnosis routine" that is executed by the ECU in FIG. 2.

As shown in FIG. 2, the ECU 51 includes a central processing unit (CPU) 52, a read only memory (ROM) 53, a random access memory (RAM) 54, and a backup RAM 55 for saving previously-stored data. The CPU 52 executes various computations in accordance with previously installed control programs. Predetermined control programs and initial data that are necessary for the CPU 52 to execute computations are previously stored in the ROM 53. The RAM 54 temporarily stores the results of operations executed by the CPU 52. The backup RAM 55 is backed up by the battery 25 to hold various types of data in the RAM 54 even after power supply to the ECU 51 is stopped. Those individual components 52 to 55, an analog/digital (A/D) converter 56, a buffer-equipped input/output (I/O) unit 57 and a controller 59 for serial communication are mutually connected by a bus 58.

The aforementioned air flow meter 34, the inlet air temperature sensor 35, the coolant temperature sensor 37, and the air-fuel ratio sensors 38 to 41 are connected to the A/D converter 56. The battery 25 is also connected to the A/D converter 56 via the ignition switch 45. The diagnosing unit 27 is detachably connected via the connector 28 to the controller 59. The engine speed sensor 31, the cylinder sensors 32 and 33, the throttle sensor 36 and the vehicle speed sensor 42 are connected to the I/O unit 57. Also connected to the I/O unit 57 are the ISCV 23, the injectors 11L and 11R, the igniters 18L and 18R and the alarm lamp 24. The heaters 38a–41a are also connected to the I/O unit 57 via a driver 60.

The CPU 52 reads detection signals from the sensors 31 to 33 and 35 to 42 and the air flow meter 34 via the A/D converter 56 and I/O unit 57. The CPU 52 reads data, sent from the diagnosing unit 27, via the controller 59. Based on the read signals, the CPU 52 controls the driving of the injectors 11L and 11R, the igniters 18L and 18R and the alarm lamp 24 via the I/O unit 57. Likewise, the CPU52 controls the heaters 38a to 41a via the I/O unit 57 and the driver 60, based on the read signals.

The diagnosis function will now be described. Two kinds of self-diagnosis programs are previously stored in the ROM 53. One of the programs is a first program which is run in normal mode (first mode) and the other program is a second program which is run in check mode (second mode) at a higher detection precision than the first program.

When the user is driving the vehicle under the normal conditions, the diagnosing unit 27 is not connected via the connector 28 to the ECU 51. In this case, the normal mode is basically selected and self-diagnosis is executed in accordance with the first program.

When severer diagnosis is required, the diagnosing unit 27 is connected via the connector 28 to the ECU 51 by a dealer, in a repair shop, etc., and a service engineer performs predetermined manipulations on the various switches of the diagnosing unit 27. Then, the diagnosing unit 27 sends various types of data to the ECU 51 via the controller 59. The check mode is selected based on the data, and self-diagnosis is carried out in accordance with the second program.

The various types of data includes, for example, data about a command to switch the normal mode to the check mode (mode switching command) and data about a return pattern that is used to automatically return to the normal mode from the check mode. In this embodiment, when the ignition switch 45 has been turned on or off by a predetermined number of times (e.g., five times) or more, it is considered to be the return mode. Specifically, when the switch 45 has been turned on or off by a predetermined number of times, it is considered that self-diagnosis in check mode is no longer performed. If this conditions is met, therefore, there should be no problem to switch to the normal mode from the check mode.

When the ignition switch 45 is set on and the battery voltage is applied to the ECU 51, the ECU 51 executes an initial routine to initialize various types of data. In this routine, the ECU 51 counts the number of the ON/OFF actions of the switch 45 and stores the count value in the backup RAM 55. When the count value is incremented by "1" and reaches a predetermined value, the ECU 51 clears the count value.

A description will now be given of the operation and advantages of the thus constituted embodiment. The flow chart in FIG. 3 illustrates a "self-diagnosis routine", one of processes executed by the ECU 51. The individual processes in this self-diagnosis routine are executed every predetermined time based on a check mode flag CMF. The flag CMF is set to "1" when the check mode is selected as the self-diagnosis mode and is set to "0" when the normal mode is selected.

In step 101, the ECU 51 determines whether or not data is transmitted from the diagnosing unit 27. That is, the ECU 51 determines if the diagnosing unit 27 is connected via the connector 28 to the ECU 51 and data is transmitted from the diagnosing unit 27 in accordance with the manipulation of various switches of the diagnosing unit 27. If there is no data transmission from the diagnosing unit 27, the ECU 51 temporarily terminates the subsequent processing. If data is transmitted from the diagnosing unit 27, on the other hand, the ECU 51 proceeds to step 102.

In step 102, the ECU 51 determines if the flag CMF is "1". If the flag CMF is not "1", the ECU 51 determines that the normal mode is currently selected and self-diagnosis is executed in accordance with the first program, and proceeds to step 103.

In step 103, the ECU 51 determines based on the data sent from the diagnosing unit 27 whether or not there is a command to switch to the check mode. In other words, the ECU 51 determines if a service engineer has performed a predetermined manipulation on the switches of the diagnosing unit 27 in order to switch the normal mode to the check mode. If there is no mode switching command, the ECU 51 determines that the service engineer has not manipulated any switch of the diagnosing unit 27 and the normal mode is still effective, and moves to step 104. In step 104, the ECU 51 executes self-diagnosis in accordance with the first program associated with the normal mode, and then temporarily terminates the subsequent processing. In the next and subsequent control periods, therefore, self-diagnosis according to the first program continues unless a command to switch to the check mode is issued.

If the command to switch to the check mode has been issued in step 103, the ECU 51 receives a return pattern in step 105, and sets this pattern and stores it in the backup RAM 55 in step 106. That is, like in the above-described case of the mode switching command, the ECU 51 reads and sets the return pattern input by a predetermined manipulation on the diagnosing unit 27. In this case, the ECU 51 sets the event that the ignition switch 45 has been turned on or off "five times" or more, as the condition to return to the normal mode (return pattern).

In step 107, the ECU 51 sets the flag CMF back to "1" from "0" to switch the normal mode to the check mode and temporarily terminates the subsequent processing.

In the next control period, the ECU 51 determines that the decision condition in step 102 is satisfied, and executes self-diagnosis according to the second program associated with the check mode in step 108.

Then, the ECU 51 analyzes the actual running pattern of the vehicle in step 109. In this embodiment, the ECU 51 analyzes the number of the ON/OFF actions of the ignition switch 45, for example.

In the next step 110, the ECU 51 compares the running pattern, analyzed in step 109, with the return pattern, set in step 106, to determine if both patterns match with each other. In this case, the ECU 51 determines if the number of the ON/OFF actions of the ignition switch 45 is equal to or greater than "5". If the running pattern does not match with the return pattern, the ECU 51 determines that self-diagnosis according to the second program should continue, and temporarily terminates the subsequent processing. If both patterns match with each other, the ECU 51 determines that self-diagnosis according to the second program is no longer necessary and self-diagnosis should be executed according to the first program. In this case, the ECU 51 switches the flag CMF to "0" from "1" in step 111, and temporarily terminates the subsequent processing.

According to this embodiment, as described above, the return pattern is set when the self-diagnosis mode is switched to the check mode from the normal mode. When self-diagnosis according to the second program associated with the check mode is completed and the return pattern matches with the running pattern (when the ignition switch 45 has been turned on or off "five times" or more), the diagnosis mode is automatically switched to the normal mode from the check mode.

Even if the vehicle is returned to the user without setting the self-diagnosis mode back to the normal mode from the check mode after the high-precision self-diagnosis is executed according to the second program by a qualified person in a repair shop, the problem inherent to the prior art is overcome. More specifically, if the running pattern matches with the return pattern when the user tries to drive the vehicle, the self-diagnosis mode is automatically returned to the normal mode from the check mode even though no mode returning work has been done. While the user is driving the vehicle, therefore, self-diagnosis is executed mostly in accordance with the first program associated with the normal mode. Even if a slight malfunction occurs or an instantaneous malfunction that hardly affects the driving occurs, such an event can be prevented from being diagnosed as a malfunction. Accordingly, the alarm lamp 24 is not lit, so that a user does not become overanxious.

Although only one embodiment of the present invention has been described herein, it should be apparent to those skilled in the art that the present invention may be embodied in many other specific forms without departing from the spirit or scope of the invention. Particularly, it should be understood that this invention may be worked out in the following manners.

(1) Although the return pattern is set by the manipulation of the diagnosing unit 27 in the above-described embodiment, the return pattern may be set in the following manner.

Figure 4:
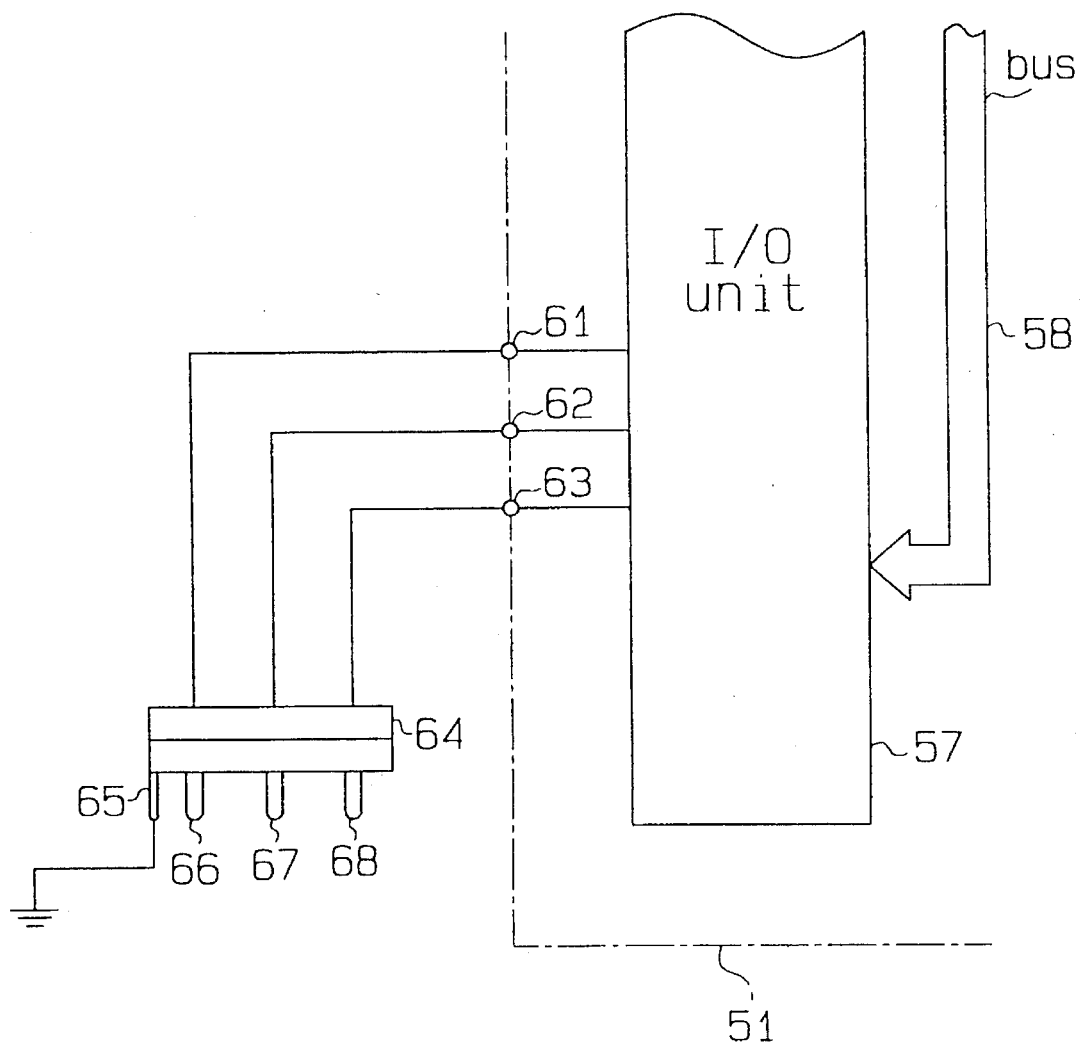
FIG. 4 is a block diagram showing a part of the electric structure of an ECU according to another embodiment.

As shown in FIG. 4, a connector 64 is connected via three input terminals 61, 62 and 63 to an I/O unit 57 of the ECU 51. The connector 64 has a plurality of external terminals 65, 66, 67 and 68 (four in FIG. 4), one (external terminal 65) of which is grounded.

At the time self-diagnosis is carried out in accordance with the second program, two or more of the external terminals 66 to 68 are short-circuited. In accordance with the combination of the external terminals 66–68 concerning this short-circuiting, one of plural types of signals is input to the I/O unit 57.

Stored in the ROM 53 are plural types of return patterns according to those input signals. The return patterns may reflect the number of the ON/OFF actions of the ignition switch 45 being equal to or greater than a predetermined number (e.g., "five times") and the vehicle speed SPD is equal to or greater than a predetermined value (e.g., "90 km/h").

The return pattern which is associated with the input signal is selected. In this way, the return pattern can be set without depending on the manipulation of the diagnosing unit 27.

(2) As a return-pattern setting method similar to the one explained in the above modification (1), only a single external terminal 66 may be used. That is, the proper return pattern may be selected in accordance with the number of times the external terminal 66 has been set on or off by a dealer per predetermined time (e.g., "1 second"). The return pattern can also be set in such manner.

(3) Although one example of the return pattern reflects the number of the ON/OFF actions of the ignition switch 45 being "5" or more in the above-described embodiment, the following return patterns are also possible.

(a) The vehicle speed SPD is equal to or greater than a predetermined value as mentioned in the case (1).

(b) The vehicle is running over a predetermined time or longer.

(c) The engine 1 is running over a predetermined time or longer.

(d) The number of the ON/OFF actions of the ignition switch 45 is equal to or greater than a value other than "5".

(e) The engine 1 has been activated a predetermined number of times or more.

(f) The 10 mode running (running pattern for measuring the exhaust gas, which has been employed since the regulation restriction in 1973) is completed.

(g) Premise conditions necessary for diagnosing specific components (e.g., the premise conditions necessary for diagnosing the air flow meter 34 are that the engine speed NE is equal to or above a predetermined value and the state in which the coolant temperature THW is equal to or higher than a predetermined level continues for a predetermined timer or longer) are satisfied.

(h) Running necessary for all the components, not just a part thereof, is conducted.

The return pattern is not limited to those mentioned above, but may be the statuses detectable by various sensors 31 to 33 and 35 to 42 and the air flow meter 34 or combinations of those statuses.

(4) Although the return pattern is set when the self-diagnosis mode is switched to the check mode from the normal mode in the above-described embodiment, the timing for setting the return pattern is not specifically limited. It is therefore possible to set the return pattern in advance at the time each vehicle is manufactured.

Therefore, the present examples and embodiment are to be considered as illustrative and not restrictive and the invention is not to be limited to the details given herein, but may be modified within the scope of the appended claims.

What is claimed is:

1. A diagnosing apparatus for use in a control system of a vehicle for controlling actuators based on signals from sensors transferred to a microcomputer to diagnose a malfunction of said control system by means of said microcomputer, wherein said microcomputer operates in a selected operation mode from a group consisting of a first mode and a second mode, said second mode being used for the diagnosis requiring a higher precision than the diagnosis according to the first mode, said apparatus comprising:

first memory means for storing a first program for detecting the malfunction of said control system and a second program having a higher detection precision than said first program;

first selecting means for selecting the operation mode of the microcomputer in accordance with an extent of the malfunction of the control system;

executing means for executing the diagnosis according to the first program when the selecting means selects the first mode, and executing diagnosis according to the second program when the selecting means switches the operation mode from the first mode to the second mode;

second memory means for storing a plurality of condition patterns of said control system for returning the operation mode of the microcomputer to the first mode from the second mode;

second selecting means for selecting a specific condition pattern among said plurality of condition patterns stored in the second memory means;

setting means for setting a condition of said control system based on the specific condition pattern selected by the second selecting means;

detecting means for detecting a status of said control system when the diagnosis is performed in the second mode; and return means for forcibly returning said diagnosis mode to the first mode from the second mode when the status detected by the detecting means matches with the conditions set by the setting means when the second mode is carried out.

2. The diagnosing apparatus as set forth in claim 1 further including an external diagnosing unit, provided separate from said control system, said external diagnosing unit being coupled to said control system to exchange data with said control system when the diagnosis based on said second program is executed.

3. The diagnosing apparatus according to claim 2, wherein said external diagnosing unit includes a switch operable to switch said first mode to said second mode and operable to set said condition of said control system for returning the operation mode from the second mode to the first mode.

4. The diagnosing apparatus according to claim 3, wherein said setting means sets the condition of the control system based on data transmitted from the external diagnosing unit after the switch thereof is manipulated.

5. The diagnosing apparatus according to claim 3, wherein said condition of said control system for returning said second mode to said first mode is preset by said setting means when the vehicle is manufactured.

6. The diagnosing apparatus according to claim 1, wherein said vehicle includes an engine and an ignition switch operable to selectively activate and deactivate the engine, and wherein said detecting means constitutes a part of said control system and includes count means for counting a number of times of manipulation of the ignition switch.

7. The diagnosing apparatus according to claim 1, wherein said detecting means includes a sensor for detecting a change in operational status of said vehicle.

8. The diagnosing apparatus according to claim 7, wherein said sensor comprises a vehicle speed sensor for detecting a speed of said vehicle.

9. The diagnosing apparatus according to claim 1, wherein said setting means includes:

a connector coupled to said control system and having a plurality of external terminals, one of said external terminals being grounded and at least two of said external terminals being short circuited, wherein a plural types of signals is input to said control system in accordance with combinations of said short-circuited external terminals;

status memory means for storing a data indicative of plurality of conditions of the control system for returning the second mode to the first mode, said plurality of statuses stored in corresponding to input signals associated with short-circuiting of said external terminals; and second selecting means for selecting one of said plurality of statuses based on the input signal associated with short-circuiting of said external terminals.

10. The diagnosing apparatus according to claim 1, wherein said setting means includes:

a connector coupled to said control system and having a plurality of external terminals, one of said external terminals being grounded and at least two of said external terminals being short circuited, wherein a plural types of signals is input to said control system in accordance with combinations of said short-circuited external terminals;

status memory means for storing a data indicative of plurality of conditions of the control system for returning the second mode to the first mode, said plurality of statuses stored in corresponding to input signals associated with short-circuiting of said external terminals; and second selecting means for selecting one of said plurality of statuses based on the input signal associated with short-circuiting of said external terminals.

11. A diagnosing apparatus including an ignition switch for selectively energizing and deenergizing an engine and sensors attached to a vehicle, said apparatus being for use in a control system for the vehicle for controlling actuators based on signals from the sensors transferred to a microcomputer to diagnose a malfunction of said control system by means of said microcomputer, wherein said microcomputer operates in a selected operation mode from a group consisting of a first mode and a second mode, said second mode being used for the diagnosis requiring a higher precision than the diagnosis according to the first mode, said apparatus comprising:

memory means for storing a first program for detecting the malfunction of said control system and a second program having a higher detection precision than said first program;

selecting means for switching the operation mode from the first mode to the second mode;

executing means for executing the diagnosis according to the first program when the selecting means selects the first mode, and executing diagnosis according to the second program when the selecting means switches the operation mode from the first mode to the second mode;

setting means for setting an operation number of the ignition switch as a condition of said control system to return the operation mode to the first mode from the second mode, wherein the operation number represents the number of times the ignition switch is operated;

counting means for counting the operation number of the ignition switch when the diagnosis is performed by the second mode; and return means for forcibly returning said diagnosis mode to the first mode from the second mode when the operation number of the ignition switch matches the number set by the setting means when the second mode is carried out.

12. The diagnosing apparatus according to claim 11, further including an external diagnosing unit, provided separate from said control system, said external diagnosing unit being coupled to said control system to exchange data with said control system when the diagnosis based on said second program is executed.

13. The diagnosing apparatus according to claim 12, wherein said external diagnosing unit includes a switch operable to switch said first mode to said second mode and operable to set said condition of said control system for returning the operation mode from the second mode to the first mode.

14. The diagnosing apparatus according to claim 13, wherein said setting means sets the condition of the control system based on data transmitted from the external diagnosing unit after the switch thereof is manipulated.

15. The diagnosing apparatus according to claim 13, wherein said condition of said control system for returning said second mode to said first mode is preset by said setting means when the vehicle is manufactured.

16. The diagnosing apparatus according to claim 11, wherein said setting means includes:

a connector coupled to said control system and having a plurality of external terminals, one of said external terminals being grounded and at least two of said external terminals being short circuited, wherein a plural types of signals is input to said control system in accordance with combinations of said short-circuited external terminals;

status memory means for storing a data indicative of plurality of conditions of the control system for returning the second mode to the first mode, said plurality of statuses stored in corresponding to input signals associated with short-circuiting of said external terminals; and second selecting means for selecting one of said plurality of statuses based on the input signal associated with short-circuiting of said external terminals.

17. A diagnosing apparatus including an ignition switch for energizing and deenergizing an engine and sensors attached to a vehicle, said apparatus being for use in a control system for the vehicle for controlling actuators based on signals from the sensors transferred to a microcomputer to diagnose a malfunction of said control system by means of said microcomputer, wherein said microcomputer operates in a selected operation mode from a group consisting of a first mode and a second mode, said second mode being used for the diagnosis requiring a higher precision than the diagnosis according to the first mode, said apparatus comprising:

memory means for storing a first program which detects the malfunction of said control system and a second program having a higher detection precision than said first program;

determining means for determining the operation mode of the control system;

executing means for executing the diagnosis according to the first program when the determining means determines the first mode, and executing diagnosis according to the second program when the operation mode is switched from the first mode to the second mode;

an external diagnosis device apart from the control system, said external device being arranged to be selectively connected with and disconnected from the control system, wherein said external device and said control system outputting data signal to each other;

mode switching means for switching the operation mode from the first mode to the second mode based on the data signal provided by the external device;

setting means for setting an operation number of the ignition switch as a condition of said control system based on the data signal provided by the external device so as to return the operation mode to the first mode from the second mode, wherein the operation number represents the number of times the ignition switch is operated;

counting means for counting the operation number of the ignition switch when the diagnosis is performed by the second mode; and return means for forcibly returning said diagnosis mode to the first mode from the second mode when the operation number of the ignition switch matches the number set by the setting means when the second mode is carried out.

18. The diagnosing apparatus according to claim 17, wherein said external diagnosing unit includes a switch operable to switch said first mode to said second mode and operable to set said condition of said control system for returning the operation mode from the second mode to the first mode.

19. The diagnosing apparatus according to claim 18, wherein said setting means sets the condition of the control system based on data transmitted from the external diagnosing unit after the switch thereof is manipulated.

20. The diagnosing apparatus according to claim 18, wherein said condition of said control system for returning said second mode to said first mode is preset by said setting means when the vehicle is manufactured.

* * * * *

UNITED STATES PATENT AND TRADEMARK OFFICE
CERTIFICATE OF CORRECTION

PATENT NO. : 5,553,488  
DATED : September 10, 1996  
INVENTOR(S) : Satoshi Ishii et al.

Page 1 of 2

It is certified that error appears in the above-indentified patent and that said Letters Patent is hereby corrected as shown below:

On the title page, item [63], change " Continuation of Ser. No. 287,395 " to --Continuation of Ser. No. 281,395".

In the Abstract: line 4: Change "requiring" to --requires--.
line 11: Change "are" to --is--.
line 13: After "sensors" insert --when--.

| Column | Line | |
|---|---|---|
| 1 | 67 | After "system" delete ",". |
| 2 | 54 | After "and" start new paragraph. |
| 3 | 19 | Change "responsive" to --response--. |
| 3 | 23 | After "...Q)" delete ",". |
| 4 | 1-2 | Change "responsive" to --response--. |
| 4 | 26 | After "from" insert --being--. |
| 4 | 28 | Change "tive" to --tively--. |

UNITED STATES PATENT AND TRADEMARK OFFICE
CERTIFICATE OF CORRECTION

PATENT NO. : 5,553,488

DATED : September 10, 1996

INVENTOR(S) : Satoshi Ishii et al.

It is certified that error appears in the above-indentified patent and that said Letters Patent is hereby corrected as shown below:

| Column | Line | |
|--------|------|---|
| 5 | 5 | Change "make" to --makes--. |
| 5 | 42 | Change "CPU52" to --CPU 52--. |
| 6 | 4 | Delete "by". |
| 6 | 5 | After "times" delete ")"; after "more" insert --)--. |
| 6 | 7 | Delete "by". |
| 6 | 9 | Change "conditions" to --condition--. |
| 8 | 55 | Change "timer" to --times--. |

Signed and Sealed this

Eleventh Day of February, 1997

BRUCE LEHMAN

Attest:

Attesting Officer

Commissioner of Patents and Trademarks